(12) United States Patent
Nonaka et al.

(10) Patent No.: US 7,485,900 B2
(45) Date of Patent: Feb. 3, 2009

(54) NITRIDE SEMICONDUCTOR DEVICE AND A MANUFACTURING METHOD THEREFOR

(75) Inventors: Mitsuhiro Nonaka, Anan (JP); Hiroaki Matsumura, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/306,299

(22) Filed: Dec. 22, 2005

(65) Prior Publication Data

US 2006/0205229 A1    Sep. 14, 2006

(30) Foreign Application Priority Data

Dec. 24, 2004  (JP)  ............... 2004-373642
Nov. 18, 2005  (JP)  ............... 2005-333726

(51) Int. Cl.
*H01L 27/15*  (2006.01)

(52) U.S. Cl. .................... 257/99; 257/79; 257/E33.062

(58) Field of Classification Search .................. 257/81, 257/99, 79

See application file for complete search history.

(56) References Cited

U.S. PATENT DOCUMENTS

2002/0000558 A1*  1/2002  Morimoto ................ 257/79
2003/0001238 A1*  1/2003  Ban ......................... 257/627
2003/0030053 A1*  2/2003  Kawakami et al. ........... 257/72
2004/0245540 A1    12/2004  Hata et al.

FOREIGN PATENT DOCUMENTS

JP           11/214798 A     8/1999

* cited by examiner

*Primary Examiner*—Jack Chen
*Assistant Examiner*—Matthew Reames
(74) *Attorney, Agent, or Firm*—Global IP Counselors, LLP

(57) ABSTRACT

The present invention provides a nitride semiconductor device wherein on a substrate having a first main surface and a second main surface, a nitride semiconductor layer is formed on the first main surface and an electrode is formed on the second main surface, wherein the substrate comprises dislocation concentration regions, and on the dislocation concentration regions on the second main surface of the substrate, the electrode having at least an opening region is formed, and the edge surface of the substrate has a region roughly matching the edge surface of the electrode formed on the dislocation concentration regions. With the present invention, device separation can be stabilized and a nitride semiconductor device is provided having good ohmic contact between a nitride semiconductor layer and electrode.

21 Claims, 13 Drawing Sheets (a)

(b)

(a)

(b)

(c)

NITRIDE SEMICONDUCTOR DEVICE AND A MANUFACTURING METHOD THEREFOR

BACKGROUND OF THE INVENTION

The present invention relates to a nitride semiconductor device and a manufacturing method therefore, more specifically, it relates to a nitride semiconductor device having an electrode on the rear surface of a substrate.

Nitride semiconductors are used in light-emitting devices such as LED devices and laser devices, solar cells, passive light devices such as optical sensors, and electronic devices such as transistors and power devices.

LED devices using nitride semiconductors are widely used, for example, in traffic signal devices, large displays, light sources for backlights, and light sources for vehicles.

Laser devices using nitride semiconductors can be used as a light source for optical disks, light source for exposure, printers, optical communication systems, measurement and the like. Further, because their wavelengths oscillate within a wavelength region of 360 nm to 550 nm, laser devices comprising nitride semiconductors can be used as excitation light sources for biotech-related devices.

LED devices and laser devices using nitride semiconductors comprise a substrate made of sapphire or the like, on which are stacked, in the following order, an n-type nitride semiconductor layer, an active layer, and a p-type active layer, and a p-electrode is formed on the p-type nitride semiconductor layer.

Because a sapphire substrate has insulating properties, an electrode cannot be formed on the rear surface thereof. For this reason, by etching or otherwise removing the p-type nitride semiconductor layer and active layer from the nitride semiconductor layer stacking surface side, an n-electrode is formed on the n-type nitride semiconductor layer thus exposed. In other words, a p-electrode and n-electrode are formed on the stacking surface side of the semiconductor layer.

A sapphire substrate not only has a different lattice constant and coefficient of thermal expansion from the nitride semiconductor layer grown thereupon, it also has no cleavage. Therefore, it has been reported that the sapphire substrate is removed by polishing and the like because it is difficult to separate by cleavage nitride semiconductor layers including a sapphire substrate into devices. In other words, after the sapphire substrate is removed, the exposed nitride semiconductor layer is caused to function as the substrate. Because such a nitride semiconductor layer contains n-type dopants, an n-electrode can be formed on the surface opposite the growth surface of the nitride semiconductor layer. Thus, a p-electrode and n-electrode are disposed so as to oppose each other across a semiconductor layer.

With such a configuration, chip size can be made smaller than a configuration where a p-electrode and n-electrode are disposed on the semiconductor stacking surface side, thus improving yield.

To cause such a nitride semiconductor layer to function as a substrate, there is need for a certain film thickness, and in light of durability and other device properties, low dislocation is also needed. In order to achieve low dislocation for such a nitride semiconductor substrate, first, a mask layer is formed on a prescribed portion of the sapphire substrate. With the mask layer as a selective growth mask, from the mask opening an n-type nitride semiconductor layer is grown on the mask layer in the lateral direction. Thereafter, the sapphire substrate and mask are removed, resulting in an n-type nitride semiconductor layer substrate (e.g., JP-H11-214798-A).

Even with a nitride semiconductor substrate given low dislocation with such a method, dislocation concentration regions exist within the substrate. Because this dislocation is propagated to the nitride semiconductor layer grown on the substrate surface, dislocation concentration regions also exist in the nitride semiconductor layer of divided nitride semiconductor devices. For this reason, regions caused to function as a nitride semiconductor layer active layer and a light-emitting layer must avoid the dislocation concentration regions, and must be formed separated to a certain degree.

Further, in order to avoid having damage from device separation (as in division of wafer into bars or chips) extend to a region caused to function as an active layer or light-emitting layer, it is necessary to position a region caused to function as an active layer or light-emitting layer on a device inner side, so that the dislocation concentration regions are disposed on the device outer side.

However, dislocation concentration regions existing within a substrate do not necessarily exist in a consistent manner. That is, even if dislocation concentration regions exist in a striped shape on the top surface of a substrate main surface, they do not exist in a consecutive manner; for example, as shown in FIG. 5, there is a partially disconnected region 13 and a region 14 having a partially wide stripe shape. Thus, even if, as shown in FIG. 11, a rectangular electrode 51 is formed on a rear surface 101 of a substrate, when devices are divided into chips, the chip forming direction is not uniform in the dislocation concentration regions, the cleaving line extends in unexpected directions along the chip side surface, leading to chips that are partially broken (FIG. 12) or, because the cleaving direction bends, chips where the active layer region or light-emitting regions extend to the cleaving line (FIG. 13).

It is difficult to stably divide into chips nitride semiconductor devices grown on substrates in which such irregular dislocation concentration regions exist.

SUMMARY OF THE INVENTION

The present invention was conceived in light of the above circumstances, and its object is to provide a nitride semiconductor device where the separation of nitride semiconductor devices is stabilized and good ohmic contact is achieved between substrate and electrode, as well as a manufacturing method therefor.

As a result of concentrated research on dislocation concentration regions of substrates, the inventors of the present invention found that in dislocation concentration regions, conductive dopants such as n-type dopants are dispersed at a high concentration. Therefore, by actively causing dislocation concentration regions to exist within device-separated nitride semiconductor substrates and connecting such dislocation concentration regions to electrodes, better ohmic contact is achieved between substrate and electrode, thereby completing the present invention.

The present invention provides a nitride semiconductor device wherein on a substrate having a first main surface and a second main surface, a nitride semiconductor layer is formed on the first main surface and an electrode is formed on the second main surface, wherein the substrate comprises dislocation concentration regions, and on the dislocation concentration regions on the second main surface of the substrate, the electrode having at least an opening region is formed, and the edge surface of the substrate has a region roughly matching the edge surface of the electrode formed on the dislocation concentration regions.

Further, the present invention provides a nitride semiconductor device wherein on a substrate having a first main surface and a second main surface, a nitride semiconductor layer is formed on the first main surface and an electrode is formed on the second main surface, wherein the substrate is formed thereupon a nitride semiconductor selectively grown, the electrode has at least an opening region formed on the edge of the second main surface of the substrate, and the edge surface of the substrate has a region roughly matching the electrode edge surface.

Moreover, the present invention provides a manufacturing method a nitride semiconductor device wherein on a substrate having a first main surface and a second main surface, a nitride semiconductor layer is formed on the first main surface and an electrode is formed on the second main surface, comprising:

forming a nitride semiconductor layer on the first main surface of the substrate, the substrate having dislocation concentration regions;

forming the electrode on the dislocation concentration regions of the substrate second main surface;

forming an opening region on the electrode on the dislocation concentration regions; and cleaving the obtained substrate so as to roughly-match an edge surface of the substrate with an edge surface on the electrode formed on the dislocation concentration regions.

With the present invention, device separation can be stabilized and a nitride semiconductor device is provided having good ohmic contact between a nitride semiconductor layer and electrode.

DESCRIPTION OF THE PREFERRED EMBODIMENTS

Figure 1:
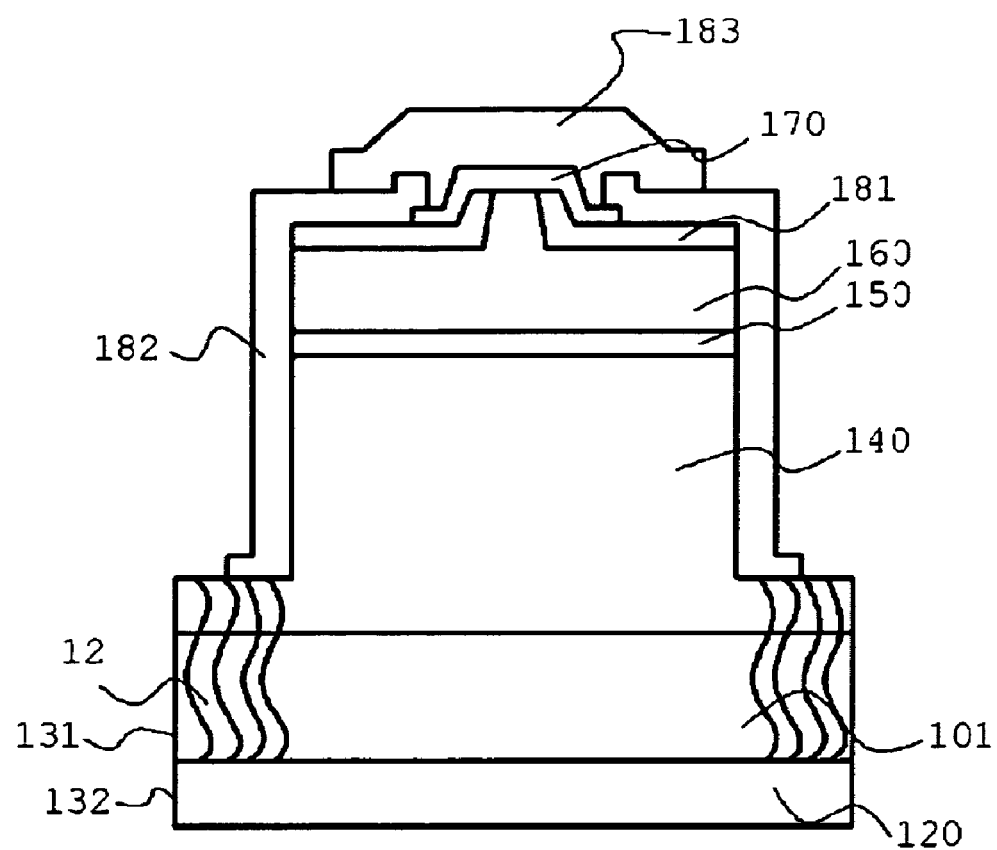
FIG. 1 is a schematic cross-sectional view showing a nitride semiconductor laser device according to the embodiment of the present invention.

In the nitride semiconductor device according to the present invention, on a substrate having a first main surface and a second main surface, a nitride semiconductor layer is formed on a first main surface and an electrode is formed on the second main surface, the substrate comprises dislocation concentration regions, and on the dislocation concentration regions on the second main surface of the substrate, the electrode having at least an opening region is formed, and the edge surface of the substrate has a region roughly matching the edge surface of the electrode formed on the dislocation concentration regions. By thus forming an electrode on the second main surface, upon device separation, as in division into bars or chips, this electrode can be caused to function as a protective film.

By disposing an electrode on a portion of the dislocation concentration regions on the second main surface of the substrate, ohmic properties between substrate and electrode can be more effectively put to use, enabling stabilization of the nitride semiconductor device potential.

Further, by disposing an electrode opening region on the dislocation concentration regions, at time of device separation, by using the opening region as a marker, the device separation position can be easily identified. Moreover, by easing stress on the opening region, device separation of nitride semiconductor devices is stabilized, and the edge surfaces of the substrate and nitride semiconductor layer can be formed as good surfaces at the desired positions; further, electrode peeling can be minimized.

While dislocation concentration regions existing within the substrate have irregular forms, device separation is affected more by the shape and characteristics of an electrode formed on the substrate surface irregularly existing within the substrate, than by such dislocation. For this reason, depending on the pattern shape of the above electrode, at time of device separation, progression of device separation in an unintended direction from such dislocation concentration regions is avoided.

Further, by roughly matching the substrate cleavage edge surface and electrode edge surface, the surface area of contact between substrate and electrode formed on the dislocation concentration regions can be expanded. Thus, even in cases where dislocation concentration regions are provided only on outer regions of a device, by making the contact surface between substrate and electrode be only at the outer region, propagation of dislocation to regions functioning as the active layer or light-emitting layer of a nitride semiconductor can be prevented, while at the same time maintaining ohmic properties.

The nitride semiconductor device of the present invention comprises a substrate having a first main surface and a second main surface, with a nitride semiconductor layer formed on the first main surface and an electrode formed on the second main surface, wherein the substrate has formed thereupon a nitride semiconductor selectively grown, and on the edge of the second main surface of the substrate, the electrode having at least an opening region is formed, and the edge surface of the substrate has a region roughly matching the electrode edge surface. With such a constitution, at time of device separation, this electrode can be caused to function as a protective film, and by using this opening region as a marker, device separation position can be easily identified. Further, by easing stress at the opening region, device separation of the nitride semiconductor devices can be stabilized, and the edge surfaces of the substrate and nitride semiconductor layer can be formed as good surfaces at the desired positions; further, electrode peeling can be minimized.

In the opening region of the above electrode, it is preferable that the second main surface of the substrate be exposed. If the bottom surface of the recess that is the opening region of an electrode formed on dislocation concentration regions is exposed to the second main surface, the slicing direction for the nitride semiconductor devices can be matched to a desired position.

Figure 6:
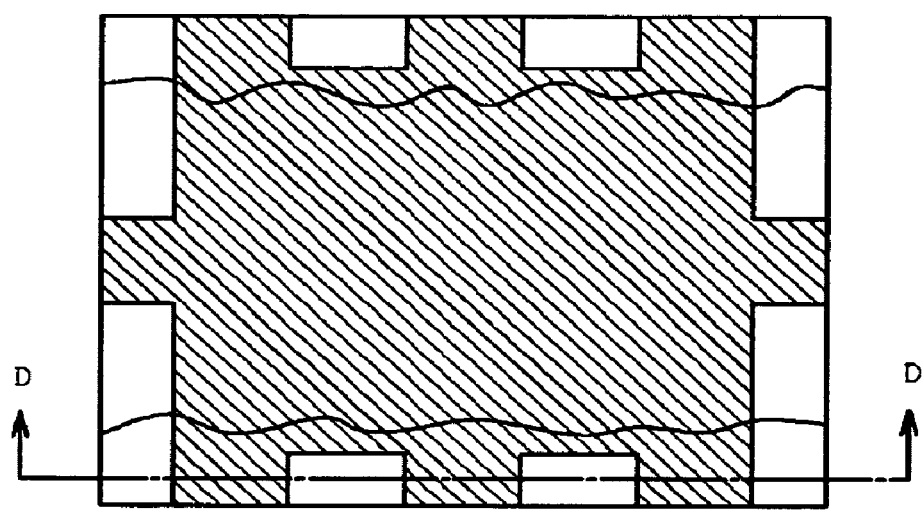
FIG. 6 is a schematic cross-sectional view showing a nitride semiconductor laser device electrode shape of the present invention.
Figure 6:
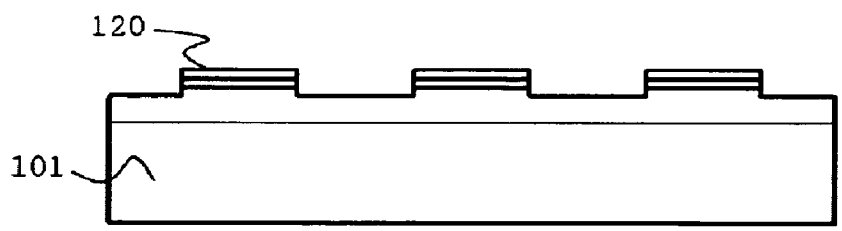
Figure 6:
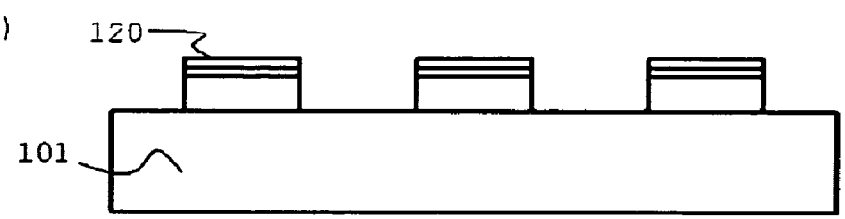

It is preferable that electrode formation regions and the opening regions of the electrode be projections and recesses that are consecutive in the substrate thickness direction. The electrode formation regions are the projections and the opening region are the recesses. More preferably, the difference in height between the projections and recesses is at least 1000 angstroms. As shown in FIGS. 6(b) and (c), on the lateral surface of the nitride semiconductor device, the consecutive projections and recesses have the same width, but one may be made wider than the other. With such a constitution, the direction of chip division can be matched to a desired position.

The above nitride semiconductor device is a laser device. By forming an electrode with good ohmic properties on the substrate second main surface, a heavier current can be applied, providing a high output laser.

It is preferable that the substrate resonator edge surface of said laser device have a surface that roughly matches the edge surface of the electrode. Because the resonator edge surface has a high concentration of stray light, by forming the electrode on such a region, stray light can be efficiently absorbed, inhibiting stray light (noise light) superimposed on a main beam.

It is preferable that in the substrate, at least one main surface have an off angle. If an off angle is formed on the substrate first main surface, the surface distribution and film thickness distribution of the nitride semiconductor device composition stacked on the substrate—e.g., crystal properties of the active layer—can be made uniform. Moreover, the active layer oscillation wavelength is not limited to a narrow range, and a laser device can be provided having excellent durability and device characteristics. Further, if an off angle is formed on the substrate second main surface, the adhesion of substrate and electrode can be improved.

It is preferable that the substrate be a nitride semiconductor substrate. With a structure such that a nitride semiconductor layer is stacked on a nitride semiconductor substrate, because there is no difference in lattice constant and coefficient of thermal expansion between substrate and nitride semiconductor layer, occurrence of cracks and dislocation can be suppressed.

The manufacturing method for the nitride semiconductor device according to the present invention is a manufacturing method for a nitride semiconductor device wherein on a substrate having a first main surface and a second main surface, a nitride semiconductor layer is formed on the first main surface and an electrode is formed on the second main surface, comprising a first step for forming a nitride semiconductor layer on a first main surface of a substrate, such substrate having dislocation concentration regions, a second step for forming the electrode on the dislocation concentration regions of the substrate second main surface, a third step for forming an opening region on the electrode on the dislocation concentration regions, and a fourth step for cleaving the obtained substrate so as to roughly-match an edge surface of the substrate with an edge surface on an electrode formed on the dislocation concentration regions. With such a manufacturing method, device separation of nitride semiconductor devices can be stabilized.

In the manufacturing method for the nitride semiconductor device, it is preferable that the opening region of the electrode expose the substrate second main surface. If the bottom surface of the recess that is the opening region of an electrode formed on a dislocation concentration regions is exposed to the second main surface, bending of the device separation direction of the nitride semiconductor devices can be suppressed.

In the manufacturing method for the nitride semiconductor device, it is preferable that the electrode be used as a mask for substrate cleaving. Because the electrode is pattern formed on the substrate second main surface, such substrate will be a more influential factor in cleaving than the substrate. For this reason, by using such an electrode as a mask for cleaving nitride semiconductor devices, device separation of nitride semiconductor devices can be stabilized.

An explanation will now be given in more detail regarding a nitride semiconductor device for the present invention.

A nitride semiconductor device of the present invention comprises a substrate having a first main surface and second main surface, a nitride semiconductor layer, and an electrode. Below, a nitride semiconductor device will be explained as a laser device, but this nitride semiconductor device is not limited to a laser device.

The nitride semiconductor device of the present invention, as shown in FIG. 1, is a laser device having a counter electrode structure, comprising a substrate 101 having a first main surface 101a and second main surface 101 b, on the first main surface are stacked, in the following order, as a nitride semiconductor layer 110, an n-type nitride semiconductor layer 140, an active layer 150, and a p-type nitride semiconductor layer 160, and on the second main surface is formed an n-electrode 120. The p-type nitride semiconductor layer 160 comprises a stripe shaped ridge portion and a p-electrode 170 formed thereupon.

Because this laser device has a counter electrode structure employing a conductive substrate, a large current can be applied, enabling high-power oscillation.

The substrate 101 comprises dislocation concentration regions 12.

The dislocation concentration regions 12 are regions having a higher dislocation density than other regions 11. For example, when a dislocation density of other regions 11 is $5 \times 10^6/cm^2$ or less, the regions having a higher dislocation density are dislocation concentration regions. Also, dislocation concentration regions have a dislocation density of at least $1 \times 10^7/cm^2$. While no limitations are made with respect to dislocation density measuring method, a CL (cathode luminescence) method is usually employed.

Figure 5:
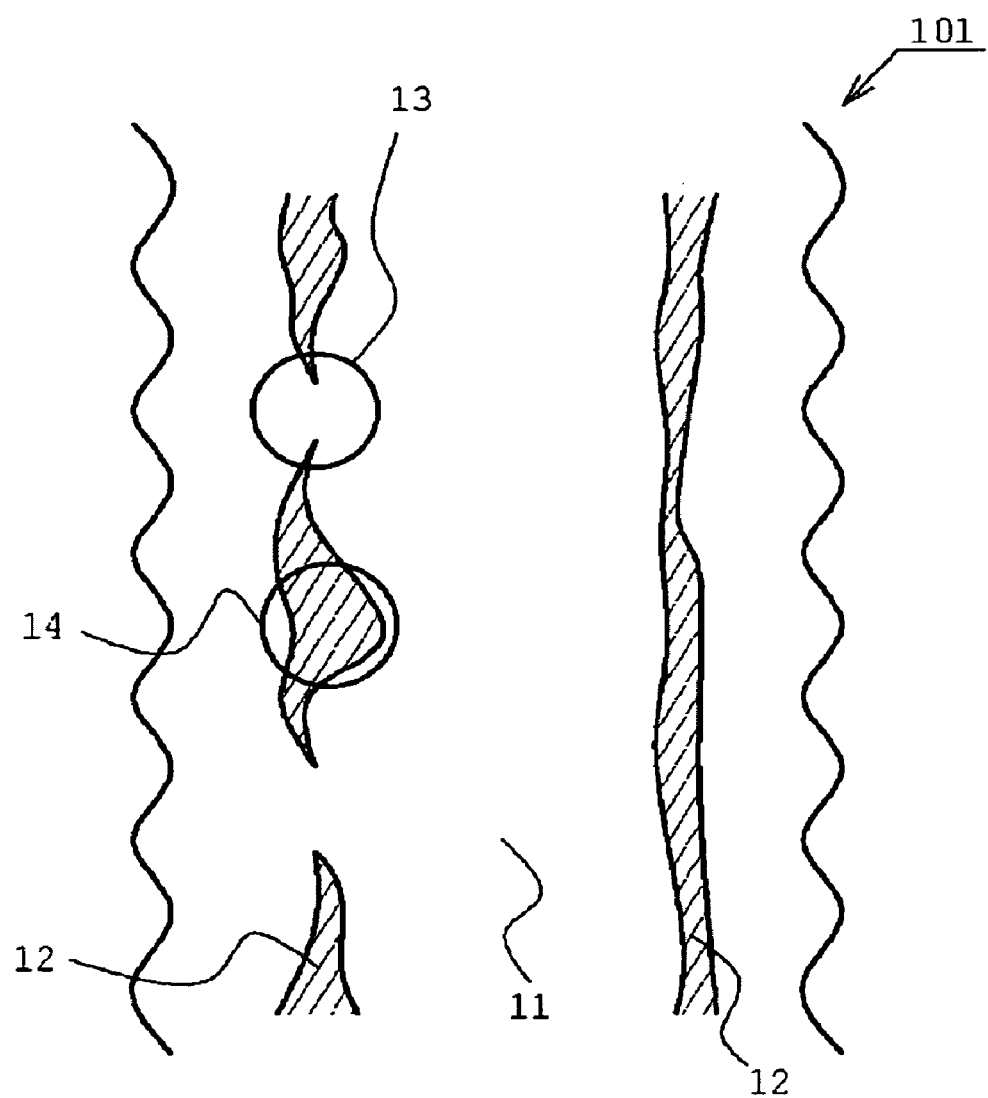
FIG. 5 is a schematic plan view showing a nitride semiconductor laser device nitride semiconductor substrate of the present invention.

Dislocation concentration regions exist at least on the first and/or second main surface in a stripe shape, grid shape, striped shape, mesh shape, dot shape or the like. However, as shown in FIG. 5, such shapes do not exist consecutively in a consistent manner, as there are partially disconnected regions 13 and regions 14 having a partially wide stripe shape. If on the substrate 101 dislocation concentration regions 12 exist in a stripe shape, the dislocation concentration regions extend in stripes having a width of 0 to 50 μm. The average width is 10 to 30 μm, and 0 μm indicates a partially disconnected region 13. Further, a region having a width of 50 μm indicates a region 14 having a partially wide stripe shape. The other region 11, or region having a lower dislocation, exists in an alternating manner with the dislocation concentration regions 12. The other region 11 extends as a stripe having a width of 50 to 500 μm, within which a stripe shape ridge portion is formed.

The other region 11 may have a high luminescence region.

Figure 2:
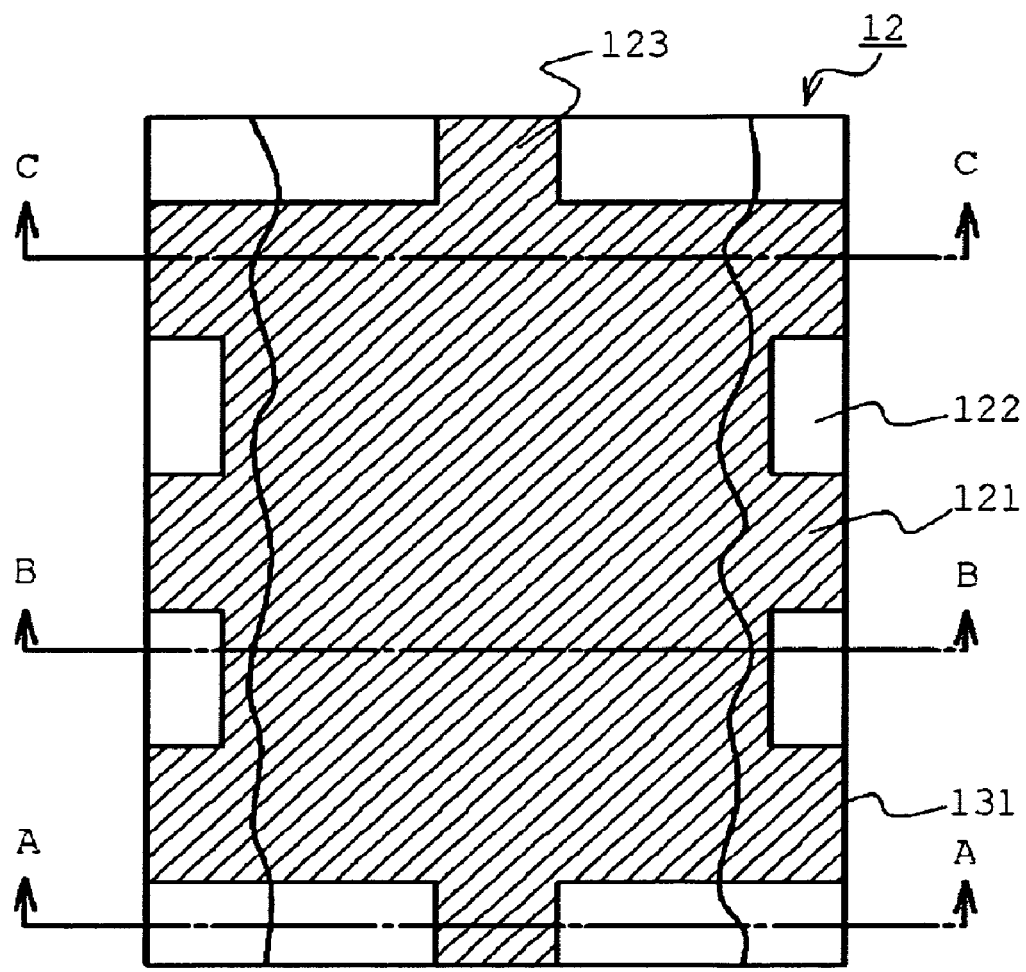
FIG. 2 is a schematic plan view showing a nitride semiconductor laser device electrode shape of the present invention.
Figure 8:
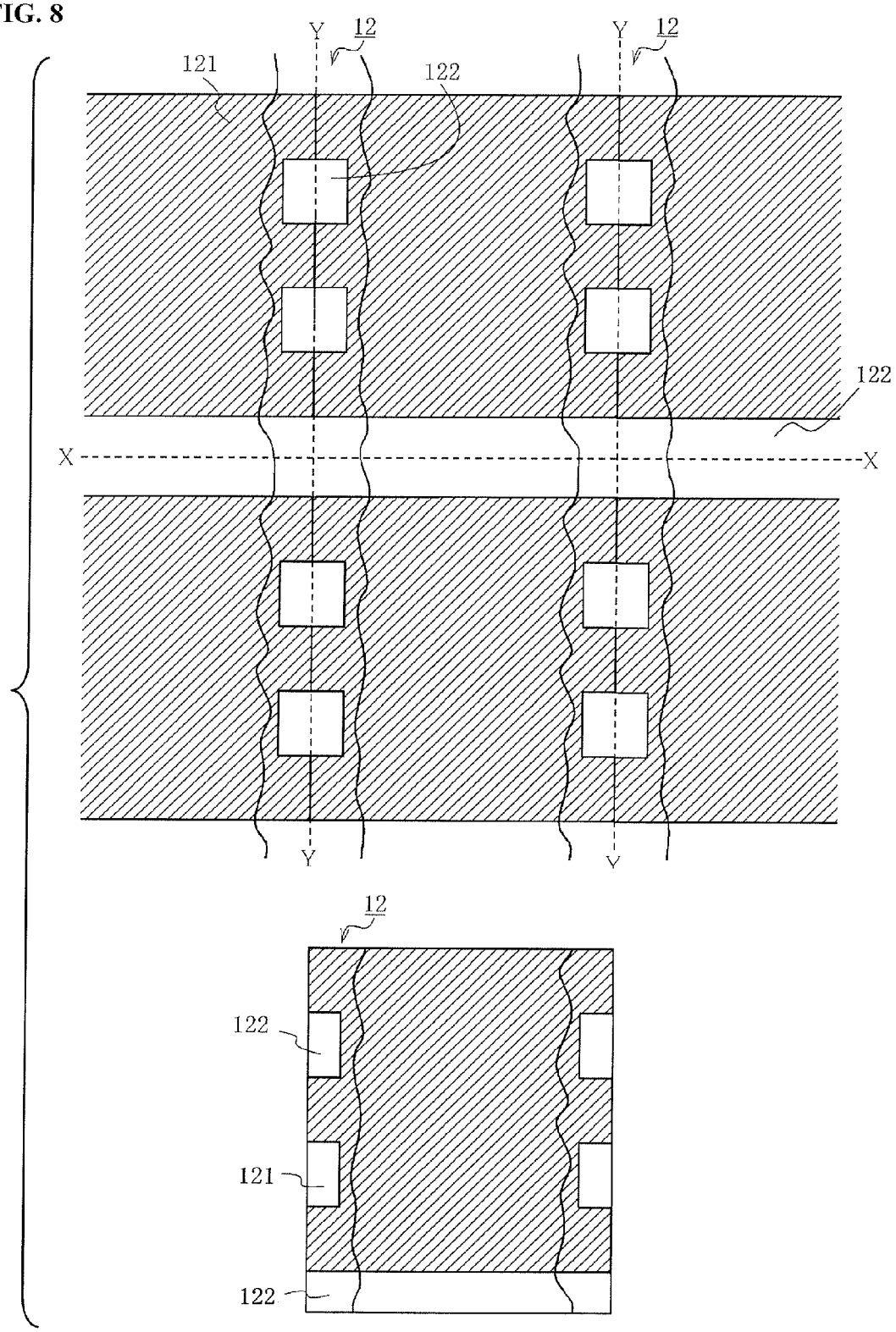
FIG. 8 is a schematic plan view showing another nitride semiconductor laser device electrode shape of the present invention.
Figure 9:
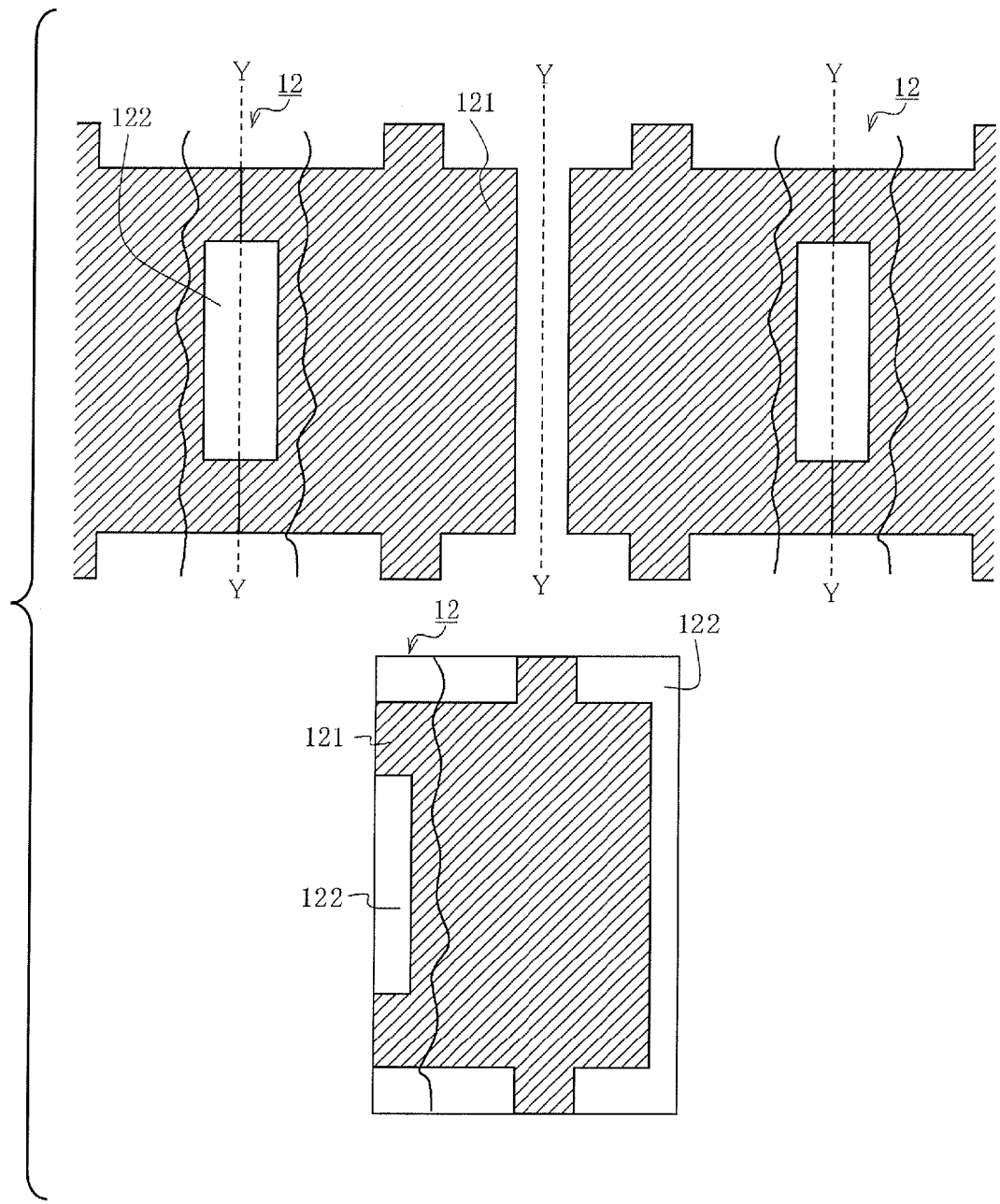
FIG. 9 is a schematic plan view showing yet another nitride semiconductor laser device electrode shape of the present invention.

As shown in FIGS. 2, 8 or the like, a laser device may have the dislocation concentration regions 12 on both sides of a chip, and as shown in FIG. 9, it may have the dislocation concentration regions 12 on either right or left side of a chip.

The substrate 101 has conductive properties. It is preferable that a substrate dopant concentration is adjusted to be within a range of $1\times10^{17}/cm^3$ to $1\times10^{21}/cm^3$, and more preferably, within a range of $5\times10^{17}/cm^3$ to $1\times10^{20}/cm^3$. With the adjustment within such ranges, an ohmic contact can be achieved between a substrate and n-electrode.

A substrate is selected from among a GaN or other nitride semiconductor substrate, SiC and Si. Here, the first main surface 101a of the nitride semiconductor substrate is the C plane, M plane or A plane. When the first main surface 101a of the nitride semiconductor substrate may be the C plane (0001), the second main surface 101b may be the (000-1) plane. Further, the substrate other region 11 and dislocation concentration regions 12 may be surfaces having reverse polarity from each other. When the other region 11 of the first main surface 101a may be the (0001) plane, the dislocation concentration regions 12 may be the (000-1) plane, (11-20) plane, (10-15) plane, (10-14) plane, (11-24) plane and the like. When the other region 11 of the second main surface 101b may be the (000-1) plane, the dislocation concentration regions 12 may be the (0001) plane and the like.

The substrate first and/or second main surface may have an off angle. An off angle is an angle of inclination between 0.05° and 0.7° formed with respect to the C plane, A plane or M plane. If an off angle is formed within this range, device properties can be stabilized within a range from an ultraviolet region where a laser device oscillation wavelength is 365 nm or less to a longer wavelength region where a laser device oscillation wavelength is 500 nm or more. More specifically, the active layer composition distribution within a chip can be made uniform.

Figure 7:
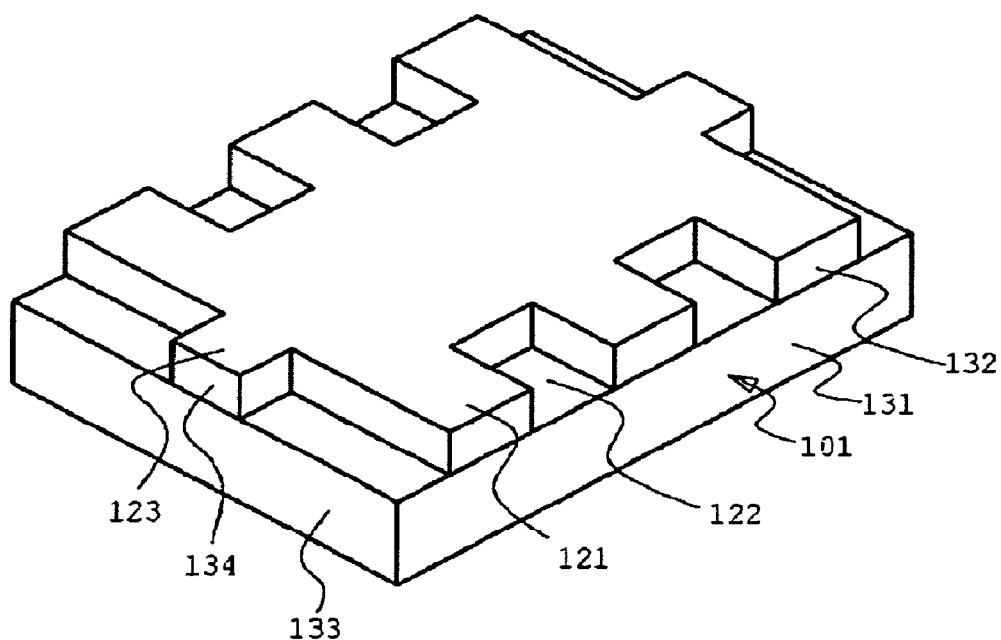
FIG. 7 is a schematic perspective view showing a nitride semiconductor laser device electrode shape of the present invention.

The dislocation concentration regions 12 of the substrate second main surface, as shown in FIGS. 2 and 7, have regions (electrode formation regions) 121 in which an n-electrode is formed, and opening regions 122. That is, the n-electrode is formed at least on the dislocation concentration regions of the substrate second main surface, but the foregoing does not preclude a configuration in which an n-electrode is formed also on regions other than the dislocation concentration regions.

The opening regions 122 are regions constituting recesses in the substrate thickness direction on the electrode formed on the substrate second main surface 101b. For example, in the n-electrode 120 formed on the substrate second main surface 101b as shown in FIG. 6a, as shown in the cross-sectional shape of the n-electrode 120 in FIG. 6b, which is a cross-sectional view along the line D of FIG. 6a, the bottom surface of the opening region (recess) is lower than the upper surface of the electrode 120, or as shown in FIG. 6c, it may reach the substrate 101 so that the substrate second main surface is exposed.

It is preferable that at least one or more opening regions 122 be formed on one device. Further, it is preferable that the opening regions 122 have a length of at least 20 μm in a resonator direction, and more preferably, at least 50 μm.

Figure 3:
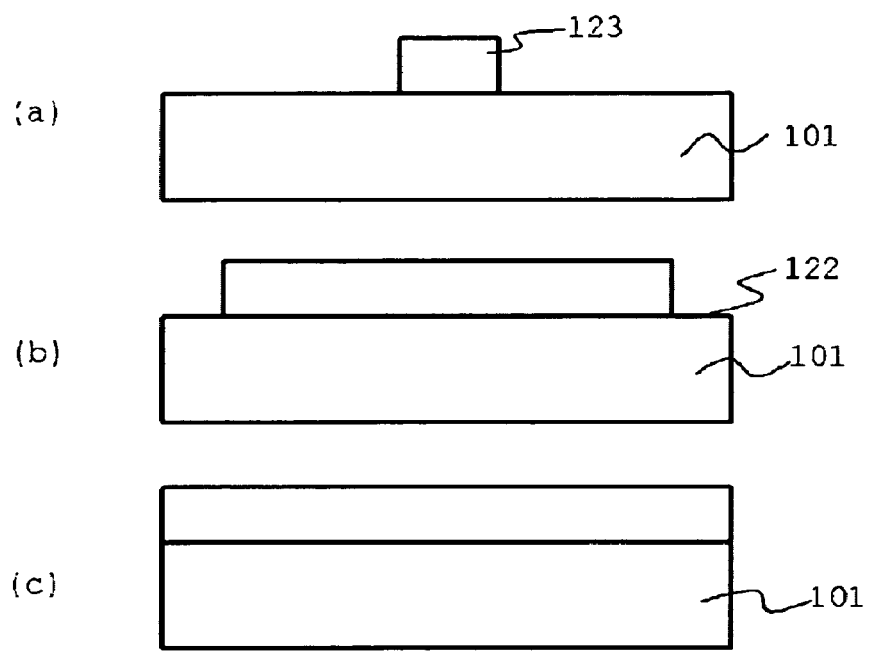
FIG. 3 is a schematic cross-sectional view showing a substrate and electrode of the nitride semiconductor laser device of the present invention.

FIG. 3b shows a cross-sectional view along the line B of FIG. 2. Opening regions 122 are formed on both sides of the n-electrode. The opening region 122 has a width between 5 μm and 200 μm inclusive, and preferably, between 50 μm and 100 μm inclusive.

Figure 4:
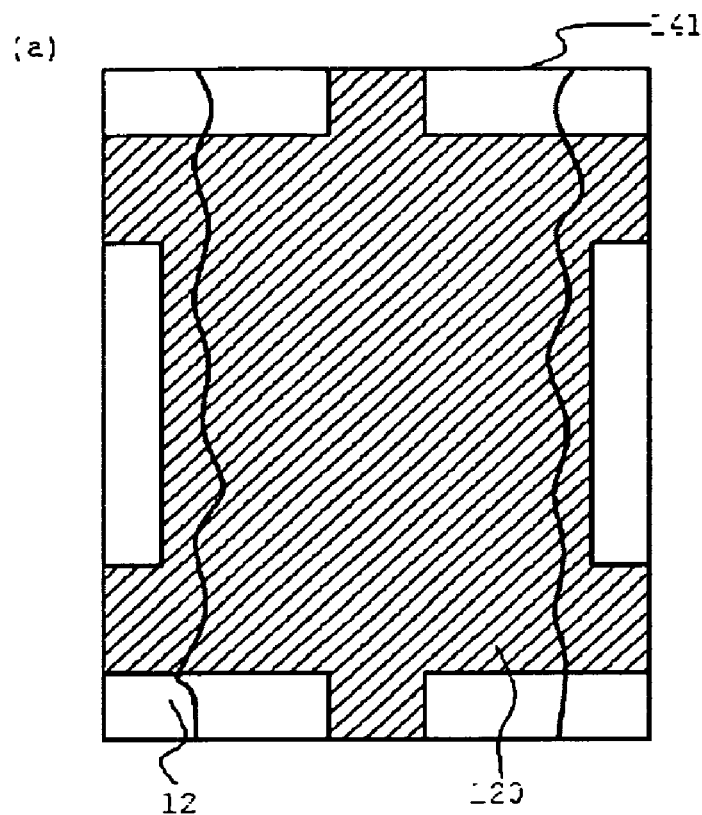
FIG. 4 is a schematic plan view showing a nitride semiconductor laser device electrode shape of the present invention.
Figure 4:
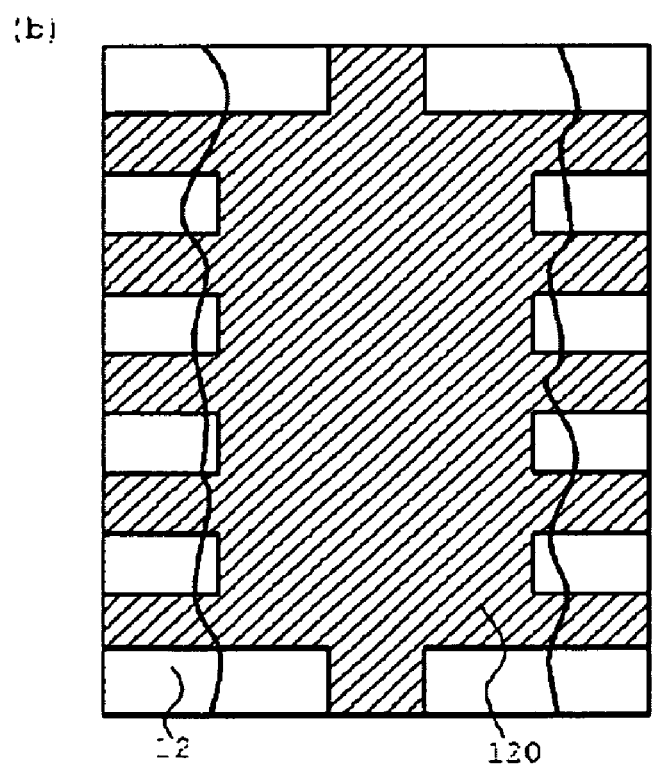

As shown in FIG. 4a, the n-electrode 120 may be configured so that the opening regions 122 extend over a wide range. More specifically, the opening regions 122 on both sides of the laser device have a width of at least 100 μm. With such an electrode shape, a device can be easily separated. Further, as shown in FIG. 4b, n-electrode opening regions 122 may be formed to extend beyond the dislocation concentration regions 12. With such an electrode shape, because electrode formation regions 121 and opening regions 122 exist in parallel on the dislocation concentration regions 12, chip formation can be easily performed.

Figure 10:
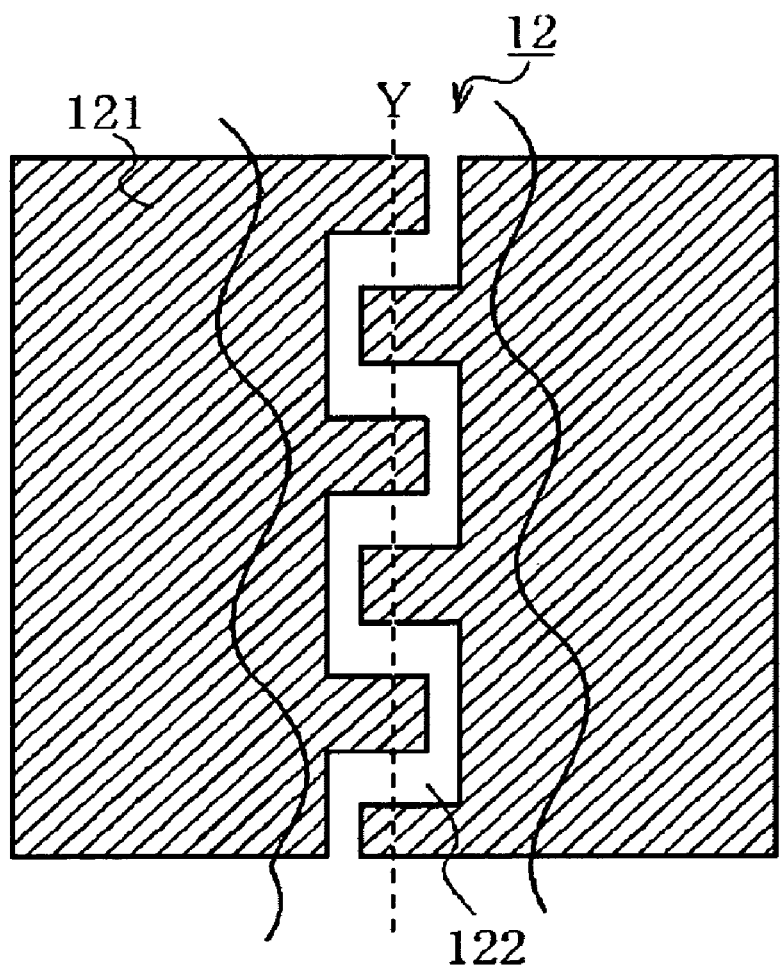
FIG. 10 is a schematic plan view showing yet another nitride semiconductor laser device electrode shape of the present invention.
Figure 11:
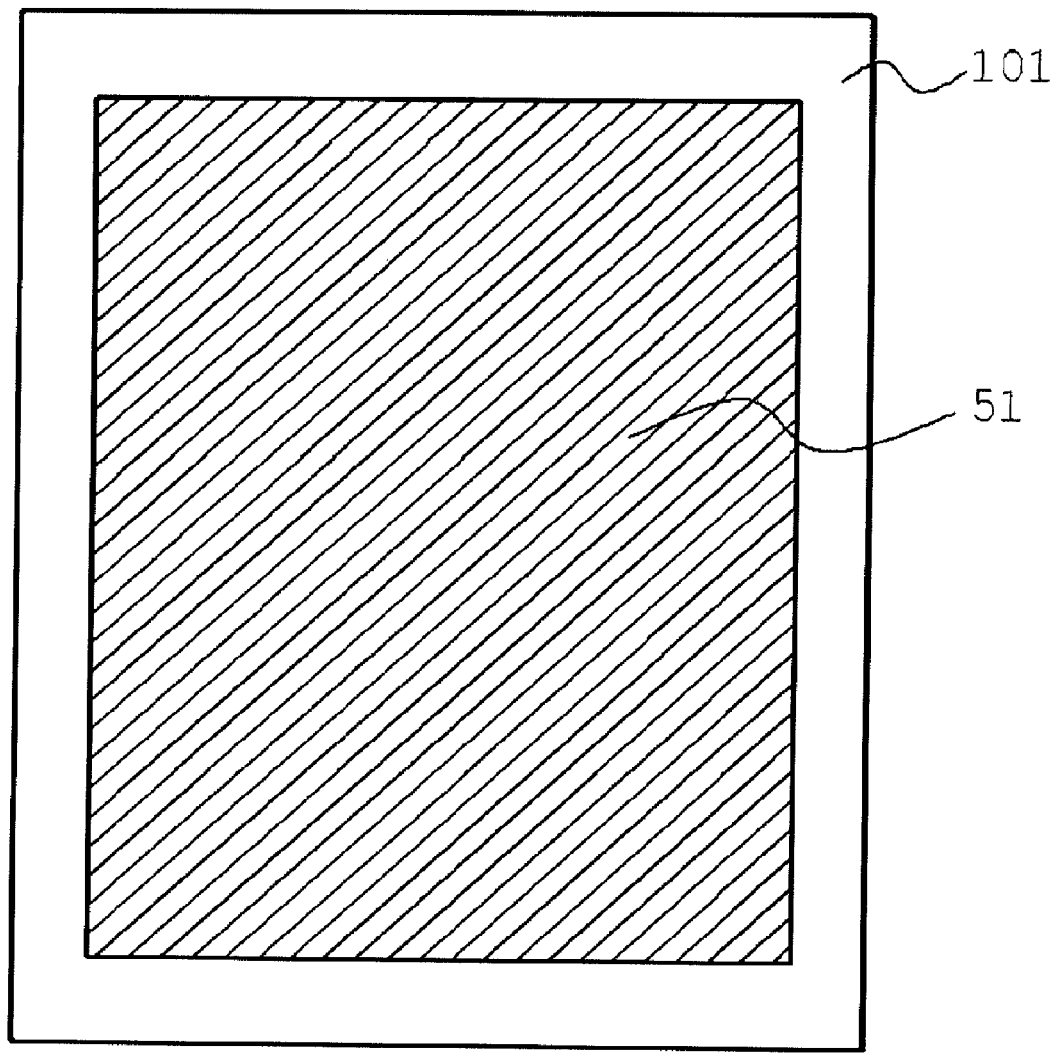
FIG. 11 is a schematic plan view showing a substrate and electrode according to prior art.
Figure 12:
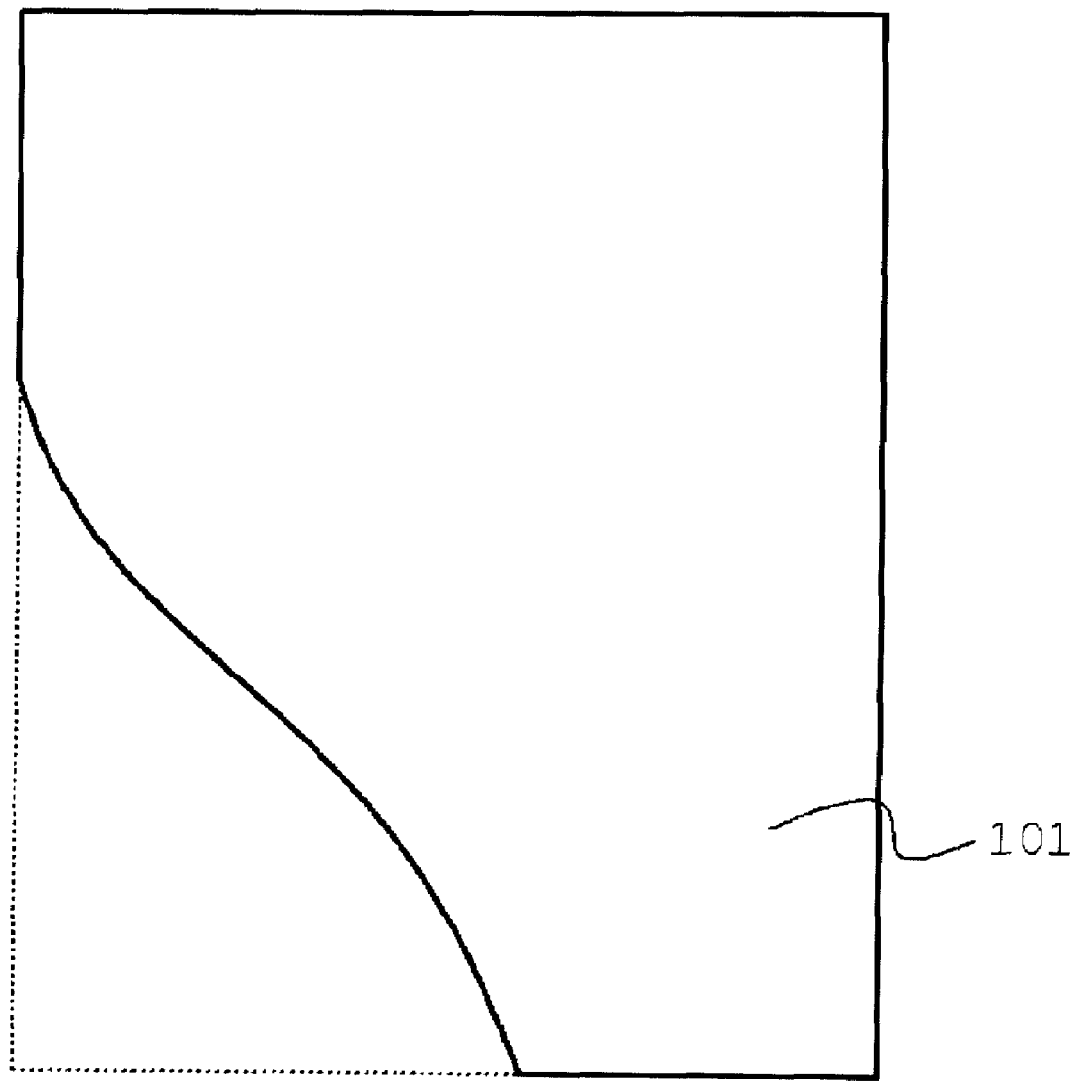
FIG. 12 is a schematic plan view of a nitride semiconductor device according to prior art.
Figure 13:
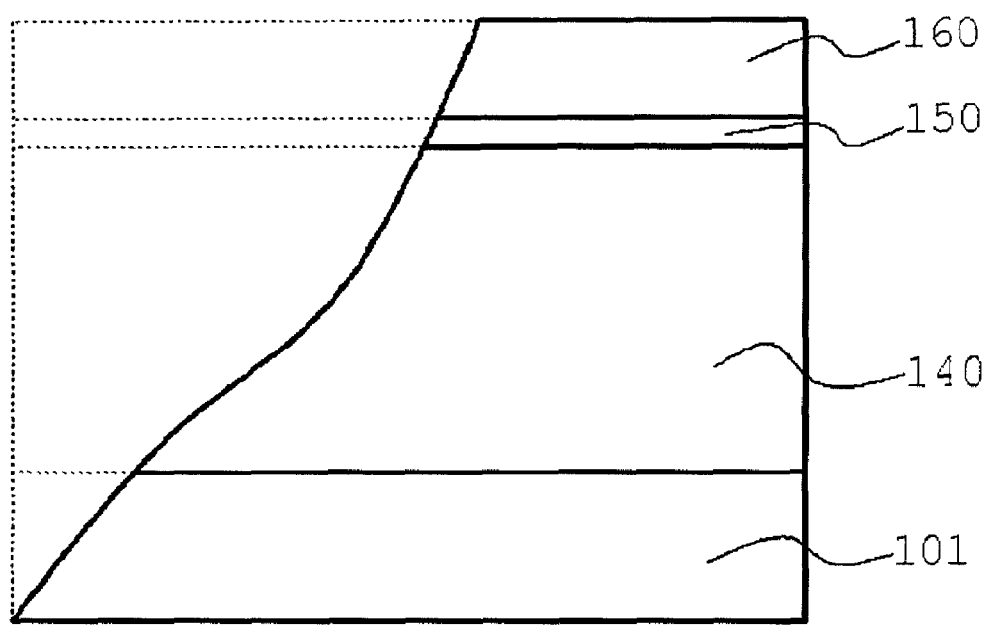
FIG. 13 is a schematic cross-sectional view showing a nitride semiconductor device according to prior art.

Further, as shown in FIG. 10, on the opening region 122, the n-electrode may be disposed so as to mesh with the electrode of an adjacent chip. Even with the opening region formed in this shape, dividing positions for chip formation can be easily identified.

On the electrode formation regions 121 of the n-electrode 120 formed on the dislocation concentration regions 12, there is provided an edge surface 132 roughly matching the lateral surface 131 of the substrate 101.

FIG. 3c shows a cross-sectional view along the line C of FIG. 2. In FIG. 3c, the lateral surface 131 of the substrate 101 and n-electrode edge surface 132 are formed so as to roughly match each other. Here, roughly matching includes, in addition to a case of complete match of the electrode edge surface and substrate edge surface, a case where there is difference of less than 10 μm in height therebetween.

Further, it is preferable that the n-electrode comprise a second region 123 having an edge surface 134 roughly matching the resonator edge surface 133 of the substrate 101. The second region 123 of the n-electrode may be formed wider than a stripe shape ridge width. The second region 123, when viewed from the n-electrode side, is formed so as to cover the ridge portion, and is shaped so as to protrude from the electrode formation region 121. More specifically, the second region 123 may be formed having a width of at least 20 μm. It is preferable that the second region 123 be provided on the light outgoing edge surface (front edge surface) side of the resonator edge surface end, more preferably on the light reflection edge surface side, which is the edge surface opposite to the light outgoing edge surface (rear edge surface), as well. With such a configuration, stray light that exists near the resonator edge surface can be absorbed.

FIG. 3a shows a cross-sectional view along the line A of FIG. 2. This second region 123 may be formed having a width of at least 20 μm on the substrate second main surface. No particular limitations are placed on the location for formation of the second region 123, provided that it covers the stripe-shaped ridge portion formed on the substrate first main surface.

It is preferable that the n-electrode 120, in a single device, be in contact with at least 60% of the entire second main surface of the substrate 101. With such a configuration, excellent heat dissipating properties can be achieved.

The n-electrode 120, whether it has a single layer structure or multilayer structure, should have a film thickness of at least 3000 Å, and preferably 1 μm or less. More preferably, it will be between 5000 Å and 1 μm inclusive. With such a configuration, scribing precision is improved, and electrode peeling can be prevented.

As one example of the n-electrode 120 being configured in a multilayer structure, a case will be described below where the n-electrode is configured in a three-layer structure in which a first, second and third layers are formed in such order from the substrate second main surface.

FIG. 6b shows a cross-sectional view along the line D of the plan view (FIG. 6a) in which the n-electrode 120 is formed on the substrate second main surface 101b. An opening region (i.e., recess) recess bottom surface is formed within the electrode, and only the first layer is present on the recess bottom surface of the opening region 122. Further, there are formed first, second and third layers on the electrode formation regions 121. A eutectic material may be used for the third layer, which is the n-electrode uppermost layer. With such a constitution, even when a material having poor cleavage is used for the second and third layers, the desired device separation can be performed. FIG. 6c shows a constitution wherein the substrate second main surface serves as the recess bottom surface of the opening region 122. Because the locations where the first, second and third layers are all formed are the electrode formation regions 121, even when a material having poor cleavage is used for an electrode, the desired device separation can be performed. The second layer may serve as the recess bottom surface of the opening regions 122.

For the n-electrode 120, an alloy or layer structure containing at least one selected from a group of V, Mo, Ti, Cr, W, Al, Zr, Au, Pd, Rh, Nb, Hf, Ta, Re, Mn, Zn, Pt and Ru may be used. Preferably, this will be an alloy or layer structure containing at least one kind selected from a group of V, Mo, Ti, Cr, W, Al, Au, Pd and Rh. More preferably, it will be a two-layer structure or three-layer structure formed of V/Pt/Au, Ti/Pt/Au, Mo/Pt/Au, W/Pt/Au, Ti/Pd/Al, Ti/Al, Cr/Au, W/Al, Rh/Al. This layer structure is preferable because the n-electrode 120 and substrate 101 have excellent adhesive properties and good ohmic contact.

Because the uppermost layer in the multilayer structure of the electrode 120 is Pt or Au, the electrode's heat dissipating properties improve. Selection of these materials as materials for the electrode to be formed on the second main surface enables in particular good ohmic properties to be obtained between the nitride semiconductor substrate and electrode. Further, excellent adhesion is achieved between the nitride semiconductor substrate and electrode, inhibiting electrode peeling in the cleaving process for dividing a wafer into bars or chips.

When the n-electrode 120 is formed in the order of Ti/Al, the n-electrode film thickness is 10000 Å or less, for example, the film thickness is 100 Å/5000 Å in the order of Ti/Al. Further, when the n-electrode 120 is such that Ti/Pt/Au are stacked in such order on the second main surface 101b of the nitride semiconductor substrate 101, the film thickness is 60 Å/1000 Å/3000 Å. As other n-electrodes 120, if the materials are Ti/Mo/Pt/Au stacked on the second main surface of the nitride semiconductor substrate 101, for example, the thicknesses will be 60 Å/500 Å/10000 Å/2100 Å. When the n-electrode is formed of Ti/Hf/Pt/Au, for example, Ti (60 Å)/Hf (60 Å)/Pt (1000 Å)/Au (3000 Å) are stacked in such order. When it is formed of Ti/Mo/Ti/Pt/Au, Ti (60 Å)/Mo (500 Å)/Ti (500 Å)/Pt (1000 Å)/Au (2100 Å) are stacked in such order. Other n-electrode can include those formed, on the second main surface of the nitride semiconductor substrate, of W/Pt/Au, W/Al/W/Au, Hf/Al, Ti/W/Pt/Au, Ti/Pd/Pt/Au, Pd/Pt/Au, Ti/W/Ti/Pt/Au, Mo/Pt/Au, Mo/Ti/Pt/Au, W/Pt/Au, V/Pt/Au, V/Mo/Pt/Au, V/W/Pt/Au, Cr/Pt/Au, Cr/Mo/Pt/Au, Cr/W/Pt/Au. After formation of the n-electrode, annealing may or may not be performed.

While no particular limitations are made with respect to the method for forming the n-electrode 120, methods wherein sputtering, vapor deposition or the like are performed while transitioning from a low degree of vacuum to a high degree of vacuum are highly suitable. Further, as an electrode patterning method, a lift-off method, etching (dry etching, wet etching) using photolithography, and the like can be used.

On the surface of the n-electrode 120, for purpose of barrier, Ti, Mo, Si, W, Pt, Ni, Rh, or an oxide or nitride thereof may be stacked. With such a configuration, chip mounting strength can be enhanced.

The nitride semiconductor layer of the present invention is formed on the substrate 101 in the order of an n-type nitride semiconductor layer 140, active layer 150 and p-type nitride semiconductor layer 160, but the present invention is not limited to the foregoing. It may be configured so that a p-type nitride semiconductor layer, active layer and n-type nitride semiconductor layer are formed in such order on the substrate. Further, the active layer 140 may have a multiquantum well structure or single quantum well structure.

It is preferable that the nitride semiconductor layer be configured in an SCH (Separate Confinement Heterostructure) structure in which an active layer containing In is sandwiched between the n-type nitride semiconductor layer and p-type nitride semiconductor layer. An optical waveguide is constituted by providing optical guide layers having a larger band gap than that of the active layer above and below the active layer.

The nitride semiconductor layer is represented by the general formula

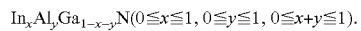

$$In_xAl_yGa_{1-x-y}N(0 \leq x \leq 1, 0 \leq y \leq 1, 0 \leq x+y \leq 1).$$

In addition, B may be partially included as a group III element. Further, N may be partly substituted with P or As, as a group III element. The n-type nitride semiconductor layer contains, as n-type dopants, a group IV element such as Si, Ge, Sn, S, O, Ti, Zr, Cd and the like, or at least any one of the group V elements. Further, the p-type nitride semiconductor layer contains, as p-type dopants, Mg, Zn, Be, Mn, Ca, Sr and the like. It is preferable that dopant concentration be within a range of $5 \times 10^{16}/cm^3$ or more and $1 \times 10^{21}/cm^3$ or less.

While no particular limitations are placed with respect to nitride semiconductor layer growth method, any method known as a nitride semiconductor growth method may be suitably employed, such as MOVPE (metalorganic vapor phase epitaxy), MOCVD (metal organic chemical vapor deposition), HVPE (hydride vapor phase epitaxy), MBE (molecular beam epitaxy) and the like. In particular, the MOCVD method is preferable because it enables growth with excellent crystal properties. Further, it is preferable that a nitride semiconductor be grown by a method selected as appropriate, depending on purpose of use, from among the various nitride semiconductor growth methods.

An explanation will now be given in more detail regarding a nitride semiconductor laser device manufacturing method for the present invention, but the present invention should not be construed as being limited thereto.

Step 1

First, the substrate 101 comprising a first main surface and second main surface is prepared. The substrate 101 is a nitride semiconductor substrate having an off angle. The film thickness of the nitride semiconductor substrate 101 is between 50 μm and 10 mm inclusive, preferably, between 100 μm and 1000 μm inclusive. Manufacturing methods for the nitride semiconductor substrate 101 include vapor growth methods such as an MOCVD method, HVPE method and MBE method, hydrothermal synthesis method for growing crystal in a supercritical fluid, high-pressure method, flux method, fusion method and the like.

The first main surface of the nitride semiconductor substrate 101 is the C plane (0001), and the second main surface thereof is the (000-1) plane. The nitride semiconductor substrate 101 comprises dislocation concentration regions 12. The dislocation concentration regions 12 are formed having a width of 0 μm to 50 μm, and the other region 11 is formed having a width of 100 μm to 500 μm. They are formed in alternating stripes. The number of dislocations per unit area in the other region 11 of the nitride semiconductor substrate 101 is $5 \times 10^6 / cm^2$ or less as measured by CL observation and/or TEM observation. Further, the nitride semiconductor substrate 101 is configured so that the full width at half maximum of the X-ray rocking curve at (0002) diffraction using the biaxial crystal method is 2 minutes or less, and preferably 1 minute or less. On the first main surface of the nitride semiconductor substrate, an off angle is formed by polishing, grinding, or laser irradiation. In a method for forming an off angle a bulk nitride semiconductor substrate is cut by a wire saw to form the first main surface. In the present specification, a bar in parenthesis indicating plane indices (−) indicates a bar to be attached on the number behind. Further, no particular limitations are placed on the nitride semiconductor substrate outer periphery shape, and it may be formed in a wafer shape, rectangular shape or the like. When it is formed in a wafer shape, it is formed in a size of at least 1 inch, and preferably at least 2 inches.

Step 2

The nitride semiconductor layer 110 is grown on the first main surface 101a of the nitride semiconductor substrate having an off angle. The following layers are to be grown by an MOCVD method under a reduced to normal pressure atmosphere. The nitride semiconductor layer 110 is configured such that, on the first main surface of the nitride semiconductor substrate 101, an n-type nitride semiconductor layer 140, an active layer 150, and a p-type nitride semiconductor layer 160 are stacked in such order. The n-type nitride semiconductor layer 140 to be stacked on the first main surface 101a of the nitride semiconductor substrate 101 is a multilayer film. It is preferable that the first n-type nitride semiconductor layer 141 be made of $Al_xGa_{1-x}N(0<x\leq0.5)$, preferably, $Al_xGa_{1-x}N(0<x\leq0.3)$. More specific growth conditions include a growth temperature in a reactor of at least 1000° C. and a pressure of 600 Torr or less. Further, the first n-type nitride semiconductor layer 141 may be caused to function as a cladding layer. The film thickness thereof is 0.5 to 5 μm.

Next, a second n-type nitride semiconductor layer 142 is formed. The second n-type nitride semiconductor layer is made of $Al_xGa_{1-x}N$ ($0\leq x\leq 03$) and functions as an optical guide layer. The film thickness thereof is 0.5 to 5 μm.

The n-type nitride semiconductor layer may comprise an intermediate layer comprising $In_xAl_yGa_{1-x-y}N$ ($0<x\leq1$, $0\leq y<1$, $0<x+y\leq1$). The intermediate layer may have a single layer structure or multilayer structure. The intermediate layer serves to reduce dislocations (through dislocation etc.) and pits on the nitride semiconductor layer surface.

The active layer 150 is represented by the general formula,

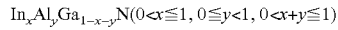

$In_xAl_yGa_{1-x-y}N(0<x\leq1, 0\leq y<1, 0<x+y\leq1)$ containing at least In. Increase of Al content enables light emission in an ultraviolet region, and enables emission in the longer wavelength region, up to 360 nm to 580 nm. Forming an active layer in a quantum well structure enhances luminescence efficiency. Here, the well layer composition is such that mixed crystal of In is $0<x\leq0.5$. The well layer film thickness is 30 to 200 angstroms and the barrier layer film thickness is 20 to 300 angstroms. The active layer multiquantum well structure may start from a barrier layer and end with a well layer, start from a barrier layer and end with a barrier layer, start from a well layer and end with a barrier layer, or start from a well layer and end with a well layer. In a preferable constitution, starting with a barrier layer, a pair of wells and barrier layers are repeated 2 to 8 times, ending with a barrier layer. An active layer configured so that a pair of wells layer and barrier layer are repeated 2 to 3 times lowers a threshold value and is desirable for enhancing durability.

A p-type nitride semiconductor layer 160 is stacked on the active layer. The first p-type nitride semiconductor layer 161 is made of $Al_xGa_{1-x}N$ ($0\leq x\leq0.5$) and contains p-type dopants. The first p-type nitride semiconductor layer 161 functions as a p-side electron confinement layer. Next, a layer made of $Al_xGa_{1-x}N$ ($0\leq x\leq0.3$) is formed as a second p-type nitride semiconductor layer 162, and a layer made of $Al_xGa_{1-x}N$ ($0\leq x\leq0.5$) containing p-type dopants is formed as a third p-type nitride semiconductor layer 163. The third p-type nitride semiconductor layer 163 preferably has a superlattice structure formed of GaN and AlGaN, and functions as a cladding layer. A layer made of $Al_xGa_{1-x}N$ ($0\leq x\leq1$) containing p-type dopants is formed in such order as a fourth p-type nitride semiconductor layer 164. Crystal of In may be mixed in these semiconductor layers. The first p-type nitride semiconductor layer 161 may be omitted. The film thickness of the layers is 30 Å to 5 μm.

After the reactions are over, in a reaction container, a wafer is annealed in a nitride atmosphere at a temperature of at least 700° C. to lower the resistance of the p-type nitride semiconductor layer. The n-type nitride semiconductor layer and p-type nitride semiconductor layer may each be configured in a single layer structure, two-layer structure, or a superlattice structure formed of two layers having different composition ratios.

Step 3

A wafer in which the nitride semiconductor layer 110 is stacked on the nitride semiconductor substrate 101 is taken out from the reaction container. Next, the n-type nitride semiconductor layer 140 is exposed by etching. While no particular limitations are placed with regard to the n-type nitride semiconductor layer surface to be exposed, in the present embodiment, it is exposed up to the first n-type nitride semiconductor layer 141. With such a configuration, there is the effect of easing stress, but this step may be omitted. An RIE method is employed for etching using $Cl_2$, $CCl_4$, $BCl_3$, $SiCl_4$ gas and the like.

Next, a stripe shape ridge portion is formed on the p-type nitride semiconductor layer. A protective film containing $SiO_2$ and the like is formed on the surface of the fourth p-type nitride semiconductor layer 164 that is the p-side semiconductor layer uppermost layer. This protective film pattern is shaped in a pattern so as to form a stripe shape ridge portion, and to remove regions other than the stripe shape ridge portion by etching. The RIE method is employed for etching using a chlorine gas such as $Cl_2$ or $CCl_4$, $SiCl_4$, $BCl_3$. The ridge portion serving as a waveguide region has a width of 1.0 μm to 30.0 μm. The resonator length is 300 μm to 1000 μm. It is preferable that the ridge portion width in case of a single mode laser beam be 1.0 μm to 3.0 μm. When the ridge portion has a width of at least 5 μm, output of at least 1 W is possible. The ridge portion height (etching depth) may be configured within a range so that at least the third p-type nitride semiconductor layer 163 is exposed, and it may be exposed up to the first p-type nitride semiconductor layer 161.

Thereafter, an insulating protective film 181 is formed on the ridge portion lateral surface. This insulating protective film 181 has a smaller refractive index than the nitride semiconductor layer and is selected from among insulating materials. Specific examples include $ZrO_2$, $SiO_2$ and oxides of V, Nb, Hf, Ta, Al and the like.

Thereafter, a p-electrode 170 is formed on the surface of the fourth p-type nitride semiconductor layer 164. It is preferable that the p-electrode 170 be formed only on the fourth p-type nitride semiconductor layer 164. The p-electrode 170 has a multilayer structure. For example, when it has a two-layer structure containing Ni and Au, Ni is formed on the fourth p-type nitride semiconductor layer having a film thickness of 50 Å to 200 Å, and Au is formed having a film thickness of 500 Å to 3000 Å. Also, when the p-electrode has a three-layer structure, Ni/Au/Pt or Ni/Au/Pd are formed in such order. The Ni and Au may have a film thickness equivalent to that of a two-layer structure, and the Pt or Pd that is the last layer has a thickness of 500 Å to 5000 Å. Further, after the p-electrode 170 is formed, ohmic annealing may be performed. With regard to specific annealing condition, the annealing temperature should be at least 300° C., preferably at least 500° C. Another condition is that the annealing atmosphere contain nitrogen and/or oxygen.

Next, a protective film 182 is formed on the n-type nitride semiconductor layer lateral surfaces or the like that have been exposed in the preceding step. Next, a pad electrode is formed on the p-electrode 170. It is preferable that the pad electrode be a laminate formed of metal such as Ni, Ti, Au, Pt, Pd, W or the like. For example, the pad electrode can be formed on the p-electrode in the order of W/Pd/Au or Ni/Ti/Au. While no particular limitations are placed with respect to pad electrode film thickness, the Au film that is the last layer should have a thickness of at least 1000 Å.

Step 4

On the second main surface 101*b* of the nitride semiconductor substrate 101, an n-electrode 120 is formed. First, patterning is performed on the second main surface 101*b* of the substrate 101 using a mask formed in any shape. The patterning method may be performed by either positive or negative photolithography. Next, the above described electrode material is formed by sputtering. For example, for the first layer V is used to form a film with thickness of 100 Å, for the second layer Pt is used to form a film with thickness of 2000 Å and for the third layer Au is used to form a film with thickness of 3000 Å. Other than sputtering, CVD, vapor deposition or the like may be employed for the formation. For the sputtering method, it is preferable that pressure be reduced in the beginning. However, for the pressure reduction in this case, it is preferable that, when the first layer is formed, the degree of vacuum be lower than when the second and third layers are formed. Thereafter, a mask patterned by lift-off is removed, thereby forming an n-electrode. After the n-electrode is formed, annealing may or may not be performed. As an example, annealing may be performed in a temperature of at least 150° C. and under an atmosphere containing nitrogen and/or oxygen.

After the n-electrode 120 is formed, a metallized electrode may be formed. Ti—Pt—Au—(Au/Sn), Ti—Pt—Au—(Au/Si), Ti—Pt—Au—(Au/Ge), Ti—Pt—Au—In, V—Pt—Au—(Au/Sn), V—P—Au—(Au/Si), V—Pt—Au—(Au/Ge), V—Pt—Au—In, Au—(Au/Sn), Au—(Au/Si), Au—(Au/Ge), Au—In, Au/Sn, In, Au/Si, Au/Ge or the like are used for the metallized electrode.

Step 5

After the n-electrode 120 is formed, a wafer is divided into bars so as to form nitride semiconductor layer resonator edge surfaces in a direction orthogonal to the striped shape p-electrode 170. It is preferable to be performed, for example, along the line X shown in FIG. 8. Here, the resonator edge surface is the M plane (1-100) or A plane (11-20). Methods for dividing a wafer into bars include blade breaking, roller breaking and press breaking.

Further, it is preferable that the wafer dividing step be performed in two steps. With this method, the resonator edge surface can be formed with improved yield. First, a cleavage support groove is formed in advance by etching or scribing from the nitride semiconductor substrate first main surface side or the second main surface side. The cleavage support groove is formed across the wafer surface and both wafer ends. It is preferable that the cleavage support groove be formed into bars in a cleaving direction in a broken line shape with intervals therebetween. With such a configuration, bending of the cleaving direction can be suppressed. Next, the wafer is divided into bars using a breaking device. Cleaving methods include blade breaking, roller breaking, press breaking or the like. The n-electrode 170 is formed on part or all of second main surface of the nitride semiconductor substrate 101.

For the present invention, the fourth process does not necessarily have to be performed after the third process, and as long as an identical constitution can be achieved, the order of the above processes may be changed.

After the resonator edge surface is formed, a reflecting mirror may be formed on the resonator edge surface. The reflecting mirror is a dielectric multilayer formed of $SiO_2$, and $ZrO_2$, $TiO_2$, $Al_2O_3$, $Nb_2O_5$ and the like. The reflecting mirror is formed on the resonating surface light reflection side and/or light exit surface. It is preferable that the reflecting mirror be formed on the resonating surface light reflection side and light exit surface. If the reflecting mirror is a resonating surface formed by cleaving, it may be formed with excellent reproducibility.

Further, the nitride semiconductor substrate configured in a bar shape is divided, for example, along the line Y of FIGS. 8-10, parallel to the electrode stripe direction to divide the nitride semiconductor laser device into chips. The shape of the semiconductor laser device after division into chips is quadrangular, and the resonator length formed in a quadrangular shape is 650 μm or less.

The nitride semiconductor laser device obtained with such a manufacturing method has properties such as long durability with inhibited occurrence of FFP ripples.

Further, it is a nitride semiconductor laser device having a counter electrode structure with reduced contact resistance, wherein the contact resistance coefficient is $1.0*10^{-3}$ $\Omega cm^2$ or less.

The nitride semiconductor device of the present invention can be used for optical disks, optical communication systems, printers, exposure, measurement and the like. Further, by shining light obtained from a nitride semiconductor laser onto a substance having sensitivity to a specific wavelength enables use for an excitation light source for biotech-related devices or the like to detect the presence of a substance or its position.

What is claimed is:

1. A nitride semiconductor device comprising:
   a substrate having a first main surface and a second main surface;
   a nitride semiconductor layer formed on the first main surface of the substrate; and
   an electrode formed on the second main surface of the substrate,
   the substrate including first edge portions and second edge portions with at least one of the first edge portions including dislocation concentration regions, the electrode having electrode formation regions and recess regions that are disposed on the dislocation concentration regions on the second main surface of the substrate with at least the electrode formation regions directly contacting the substrate, the recess regions of the electrode being arranged as one of opening regions and thin film regions, the second main surface of the substrate being continuously exposed along at least one of the first and second edge portions of the substrate, and the electrode formation regions and the recess regions of the electrode being formed at least on the first edge portion including the dislocation concentration regions so that an edge surface of the first edge portion has a region roughly matching an edge surface of the electrode formation regions.

2. The nitride semiconductor device according to claim 1, wherein the recess regions of the electrode are arranged as the opening regions that expose the second main surface of the substrate.

3. The nitride semiconductor device according to claim 1, wherein the electrode formation regions of the electrode form projections in the substrate thickness direction and the recess regions of the electrode form recesses in the substrate thickness direction with the projections and the recesses being disposed alternately.

4. The nitride semiconductor device according to claim 1, wherein the nitride semiconductor device is a laser device.

5. The nitride semiconductor device according to claim 4, wherein the substrate resonator edge surface of the laser device has a surface that roughly matches the edge surface of the electrode.

6. The nitride semiconductor device according to claim 1, wherein at least one main surface of the substrate has an off angle.

7. The nitride semiconductor device according to claim 1, wherein the substrate is a nitride semiconductor substrate.

8. A nitride semiconductor device comprising:

a substrate having a first main surface and a second main surface;

a nitride semiconductor layer formed on the first main surface of the substrate; and an electrode formed on the second main surface of the substrate, the substrate including first edge portions and second edge portions with at least one of the first edge portions including dislocation concentration regions, the electrode having electrode formation regions and recess regions being formed on the dislocation concentration regions on the second main surface of the substrate with the electrode formation regions forming projections in the substrate thickness direction and the recess regions forming recesses in the substrate thickness direction with the projections and the recesses being disposed alternately, and the second main surface of the substrate being continuously exposed along at least one of the first and second edge portions of the substrate.

9. The nitride semiconductor device according to claim 4, wherein the substrate includes a pair of resonator edge surfaces, and the dislocation concentration regions extends in a direction extending between the resonator edge surfaces.

10. The nitride semiconductor device according to claim 9, wherein the electrode formation regions and the recess regions of the electrode are disposed alternately in the direction extending between the resonator edge surfaces.

11. The nitride semiconductor device according to claim 1, wherein the edge surface of the substrate has the region roughly matching the edge surface of the electrode formation regions so that an offset amount between the edge surface of the substrate and the edge surface of the electrode formation regions is less than 10 µm.

12. The nitride semiconductor device according to claim 1, wherein the substrate has a generally rectangular shape defined by a pair of first sides extending parallel to each other and a pair of second sides extending orthogonal to the first edges with the first edge portions of the substrate being formed adjacent to the first sides, respectively, and the second edge portions of the substrate being formed adjacent to the second sides, respectively.

13. The nitride semiconductor device according to claim 1, wherein the dislocation concentration regions generally extend along the first edge portion of the substrate and the second edge portions extend substantially orthogonal to the first edge portions.

14. The nitride semiconductor device according to claim 1, wherein the nitride semiconductor device is a laser device, and one of the second edge portions of the substrate is formed adjacent to a substrate resonator edge surface of the laser device.

15. The nitride semiconductor device according to claim 1, wherein the nitride semiconductor device is a laser device, and the first edge portions of the substrate extends substantially orthogonal to a direction in which a substrate resonator edge surface of the laser device extends.

16. The nitride semiconductor device according to claim 1, wherein a majority of each of the second edge portions of the substrate does not include the dislocation concentration regions.

17. The nitride semiconductor device according to claim 8, wherein the substrate has a generally rectangular shape defined by a pair of first sides extending parallel to each other and a pair of second sides extending orthogonal to the first edges with the first edge portions of the substrate being formed adjacent to the first sides, respectively, and the second edge portions of the substrate being formed adjacent to the second sides, respectively.

18. The nitride semiconductor device according to claim 8, wherein the dislocation concentration regions generally extend along the first edge portion of the substrate and the second edge portions extend substantially orthogonal to the first edge portions.

19. The nitride semiconductor device according to claim 8, wherein the nitride semiconductor device is a laser device, and one of the second edge portions of the substrate is formed adjacent to a substrate resonator edge surface of the laser device.

20. The nitride semiconductor device according to claim 8, wherein the nitride semiconductor device is a laser device, and the first edge portions of the substrate extends substantially orthogonal to a direction in which a substrate resonator edge surface of the laser device extends.

21. The nitride semiconductor device according to claim 8, wherein a majority of each of the second edge portions of the substrate does not include the dislocation concentration regions.

* * * * *